(12) United States Patent
Narita et al.

(10) Patent No.: US 6,383,942 B1
(45) Date of Patent: May 7, 2002

(54) DRY ETCHING METHOD

(75) Inventors: Masaki Narita, Yokohama; Hiroshi Sugiura, Yokkaichi, both of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/522,168

(22) Filed: Mar. 9, 2000

(30) Foreign Application Priority Data

Mar. 11, 1999 (JP) .............................. 11-065046
Mar. 15, 1999 (JP) .............................. 11-068052

(51) Int. Cl.⁷ .............................................. H01L 21/00
(52) U.S. Cl. ........................... 438/720; 216/67; 216/75; 216/77; 438/738; 438/742
(58) Field of Search ................................ 438/712, 720, 438/722, 737, 738, 740, 742; 216/67, 75, 76, 77, 78

(56) References Cited

U.S. PATENT DOCUMENTS 4,915,779 A * 4/1990 Srodes et al. ............ 438/720 X
5,045,150 A * 9/1991 Cleeves et al. .......... 438/720 X
5,846,884 A * 12/1998 Naeem et al. ........... 438/738 X
5,952,244 A * 9/1999 Abraham et al. ........ 438/738 X

FOREIGN PATENT DOCUMENTS

| JP | 2-35731 | 2/1990 |
| JP | 7-74156 | 3/1995 |
| JP | 8-274077 | 10/1996 |

* cited by examiner

Primary Examiner—William A. Powell
(74) Attorney, Agent, or Firm—Finnegan, Henderson, Farabow, Garrett, & Dunner, L.L.P.

(57) ABSTRACT

A dry etching method is disclosed for use in patterning a stacked film of a metal film containing aluminum as the base component and a thin film including at least one of titanium and titanium nitride. In this method, the thin film is dry-etched using a first etching gas (a mixture of $CF_4$ gas, Ar gas and Cl gas) having a gas composition for preventing the metal film from being processed. The metal film is then dry-etched using a second etching gas (a mixture of Cl gas and $BCl_3$ gas) having a gas composition other than the first etching gas.

19 Claims, 15 Drawing Sheets

| STATE | BEFORE PROCESSING (a) | DURING Al PROCESSING (b) | Al END-POINT (c) | Al END-POINT + 15sec (d) | Al END-POINT + 30sec (e) |
|---|---|---|---|---|---|
| PROCESSING TIME | 0 sec | 16 sec | 31 sec | 46 sec | 61 sec |
| MASK SIZE: S | 0.175 μm | 0.176 μm | 0.175 μm | 0.193 μm | 0.223 μm |
| MASK HEIGHT: H | 0.68 μm | 0.63 μm | 0.54 μm | 0.39 μm | 0.22 μm |
| CROSS-SECTIONAL PROFILES | | | | | |

COMPARATIVE
EXAMPLE

DRY ETCHING METHOD

CROSS-REFERENCE TO RELATED APPLICATIONS

This application is based upon and claims the benefit of priority from the prior Japanese Patent Applications No. 11-065046, filed Mar. 11, 1999; and No. 11-068052, filed Mar. 15, 1999, the entire contents of which are incorporated herein by reference.

BACKGROUND OF THE INVENTION

The present invention relates to a dry etching method employed for manufacturing a semiconductor device and, more specifically, to a dry etching method for a stacked film of a metal film containing aluminum as a base metal and metal or a metal compound thin film.

Metal wiring is usually formed on a semiconductor substrate using a dry etching method.

FIG. 1 is a cross-sectional view of a semiconductor substrate on which metal wiring is formed.

As illustrated in FIG. 1, an insulation film 102 is formed on a semiconductor substrate 101. The semiconductor substrate 101 is constituted of a semiconductor such as silicon, while the insulation film 102 is constituted of an insulator such as silicon dioxide ($SiO_2$). The surface of the insulation film 102 is planarized. Metal wiring is formed on the planarized surface of the insulation film 102. The metal wiring is electrically connected to lower wiring (not shown), the semiconductor substrate 101, the gate (not shown) of a MOS transistor, or the like. The metal wiring is also connected to upper metal wiring (not shown) formed on an insulation film 105. The insulation film 105 is constituted of an insulator such as silicon dioxide ($SiO_2$) and formed on the semiconductor substrate 101 so as to coat the metal wiring.

The metal wiring is a stacked film 103 including a metal film 103a and a thin film 103b formed on the metal film 103a. The metal film 103a is constituted of metal including aluminum as a base metal and containing copper and silicon as appropriate. The thin film 103b is constituted of metal for protecting the metal film 103a and improving its reliability as wiring, a metal compound, or a stacked structure of the above metal and metal compound. Titanium and tungsten are selected as the metal, and titanium nitride and tungsten silicide are selected as the metal compound. An example of the stacked structure is shown in FIG. 1.

Conventionally the metal wiring of the stacked film 103 is formed by the steps shown in FIGS. 2A to 2D.

First, as shown in FIG. 2A, a metal film 103a containing aluminum as the base metal, a thin film 103b, and a reflection preventing film 103c are sequentially stacked on the insulation film 102 on the semiconductor substrate 101 to form a stacked film 103'. The reflection preventing film 103c is constituted of materials for preventing light from being reflected toward photoresist, such as an organic compound film containing carbon.

Then, as illustrated in FIG. 2B, photoresist is applied onto the stacked film 103' to form a photoresist film. Using an exposure technique, a pattern corresponding to the metal wiring is formed on the photoresist film. This photoresist film is developed to form a photoresist pattern 104 having a metal wiring pattern.

As illustrated in FIG. 2C, the stacked film 103' is subjected to dry etching using the photoresist pattern 104 as a mask. Thus, the stacked film 103' is formed as a metal wiring pattern.

As shown in FIG. 2D, the photoresist pattern 104 and reflection preventing film 103c are removed. Metal wiring is thus formed of a stacked film 103 of the metal film 103a and thin film 103b.

After that, as shown in FIG. 1, an insulation film 105 is deposited on the semiconductor substrate 101.

The dry etching of the stacked film 103' including the reflection protection film 103c, thin film 103b and metal film 103a containing aluminum as the base metal, is performed by a gas system including both chlorine gas ($Cl_2$) and boron trichloride ($BCl_3$). The gas system is usually used for treating an aluminum film. When the stacked film 103 is etched by the gas system containing chlorine gas and boron trichloride, if the flow rate ratio and mixture ratio of the chlorine gas are increased, the thin film 103b is etched vertically as shown in FIG. 3A. However, the metal film 103a is side-etched, and the thin film 103b overhangs the metal film 103a. If the thin film 103b overhangs, a void is likely to be caused between adjacent metal films 103a when the insulation film 105 is deposited, as shown in FIG. 4A.

On the contrary, if the flow rate ratio and mixture ratio of the chlorine gas are decreased, the side-etching of the metal film 103a is reduced as illustrated in FIG. 3B. However, the thin film 103b is not etched vertically but tapered, and its bottom portion is increased in size. If the bottom portion of the thin film 103b is increased in size, the metal film 103a is broadened, and a distance D between adjacent metal films 103a is narrowed as shown in FIG. 4B, with the result that fine metal wiring becomes difficult.

Therefore, a combination of good sides of the above two cases can be considered. The thin film 103b is etched partway by increasing the mixture ratio of the chlorine gas and then the metal film 103a is etched by decreasing it. If the mixture ratio is so changed partway, it is possible to obtain the advantages that the thin film 103b can be etched vertically and the side-etching of the metal film 103a can be prevented.

However, usually, the etching rate of the thin film 103b and metal film 103a is nonuniform within the plane of the semiconductor substrate. Consequently, the above advantages are difficult to obtain uniformly throughout the semiconductor substrate even though the mixture ratio of the chlorine gas is changed partway.

BRIEF SUMMARY OF THE INVENTION

The present invention has been developed in consideration of the above situation and its principal object is to provide a dry etching method capable of patterning a stacked film of a metal film and a thin film, formed on the metal film and including one of metal and a metal compound, in such a manner that the thin film is formed vertically and the metal film is prevented from being side-etched.

To attain the above object, there is provided a method of dry etching comprising: forming a mask layer on a stacked film above a semiconductor substrate, the stacked film including a metal film formed above the semiconductor substrate and containing aluminum as a base component and a thin film formed on the metal film and containing at least one of metal and a metal compound; and patterning the stacked film using the mask layer as a mask for etching, the patterning including: a first step of dry etching the thin film using a first etching gas having a gas composition for preventing the metal film from being processed; and a second step of dry etching the metal film using a second etching gas having a gas composition other than that of the first etching gas.

Another object of the present invention is to provide a dry etching method capable of patterning a stacked film of a barrier layer and a metal film formed on the barrier layer so as to reduce a pattern transfer difference.

To attain the above another object, there is provided a method of dry etching comprising: forming a mask layer on a stacked film above a semiconductor substrate, the stacked film including a barrier layer formed above the semiconductor substrate and a metal film formed on the barrier layer and containing aluminum as a base component; and patterning the stacked film using the mask layer as a mask for etching, the patterning including a step of dry etching the stacked film using an etching gas containing atoms of oxygen.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 17 is a table showing experimental results:

DETAILED DESCRIPTION OF THE INVENTION

Figure 1:
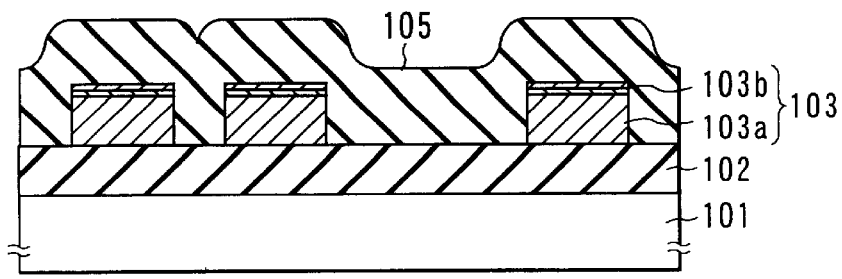
FIG. 1 is a cross-sectional view of a semiconductor substrate on which metal wiring is formed.

Embodiments of the present invention will now be described with reference to the accompanying drawings. The elements common to all the drawings are denoted by the same reference numerals throughout the specification.

(First Embodiment)

Prior to the descriptions of the respective embodiments, a dry etching apparatus used for dry etching according to the present invention will be described.

Figure 5:
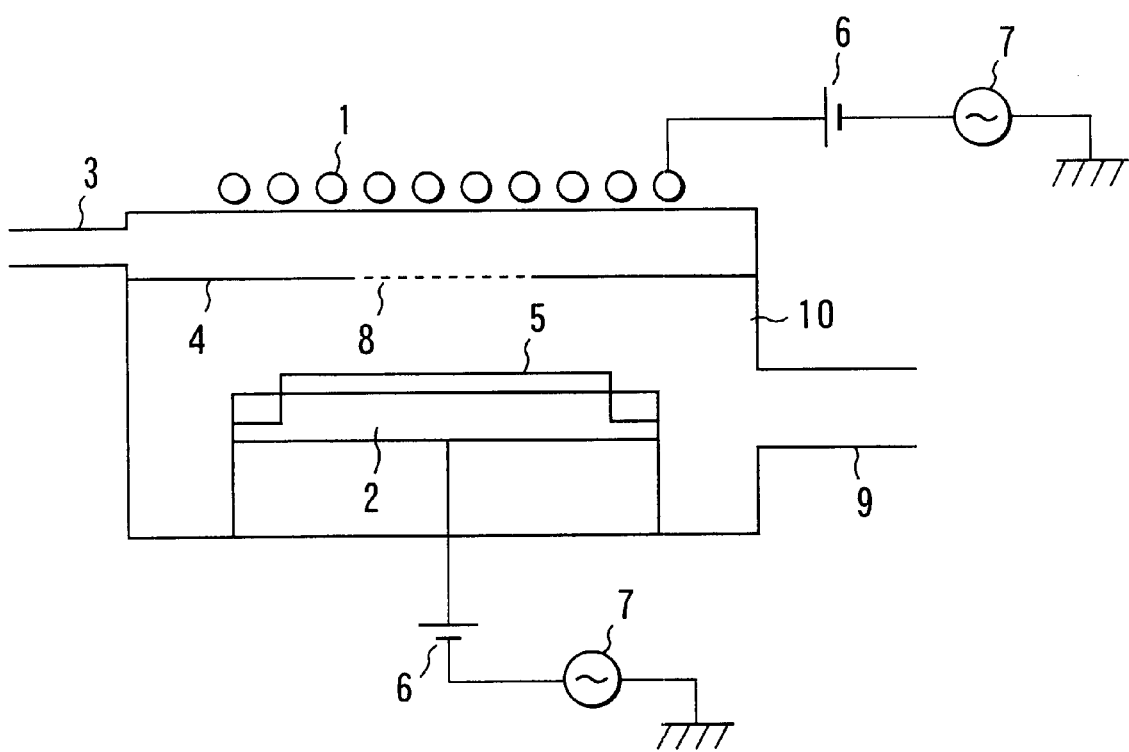
FIG. 5 is a view schematically showing a dry etching apparatus.

FIG. 5 is a view schematically showing the dry etching apparatus of the present invention.

As shown in FIG. 5, the dry etching apparatus includes an inductively coupled plasma (ICP) coil 1. A reaction treating chamber 10 is made of an aluminum alloy and its inner wall is coated with an oxide film (anodized aluminum). A subject 5, such as a semiconductor wafer, which is to be processed, is placed on a lower electrode 2 and housed in the reaction treating chamber 10. The ICP coil 1 and lower electrode 2 are connected to a high-frequency power supply 7 via a blocking capacitor 6. The power supply 7 supplies high-frequency power to the ICP coil 1 and lower electrode 2. Reactive gas is introduced from a gas inlet port 3 into the reaction treating chamber 10 through a transparent hole 8 formed in a ceramic part (partition) 4. If high-frequency power is applied to the ICP coil 1 and lower electrode 2, plasma is generated in the reaction treating chamber 10. A thin film is formed on the subject 5 and etched using the generated plasma. The reactive gas, which has reacted on the subject 5, is exhausted from the chamber 10 through an outlet port 9.

A method of manufacturing a semiconductor device using a dry etching method according to the present invention, will now be described. The dry etching method is used for patterning of metal wiring in the semiconductor device.

Figure 6:
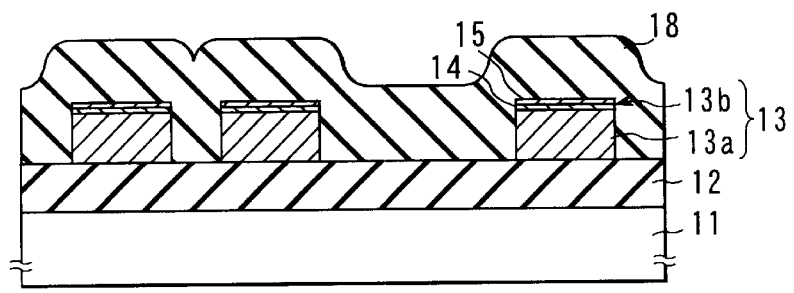
FIG. 6 is a cross-sectional view of a semiconductor substrate on which metal wiring is formed.

FIG. 6 is a cross-sectional view of a semiconductor substrate on which metal wiring is carried out.

Referring to FIG. 6, an insulation film 12 is formed on a semiconductor substrate (wafer) 11. The semiconductor substrate 11 is constituted of a semiconductor such as silicon, while the insulation film 12 is formed of an insulator such as silicon oxide ($SiO_2$). The surface of the insulation film 12 is planarized, and metal wiring (stacked film) 13 is formed on the planarized surface of the insulation film 12. The metal wiring is electrically connected to its underlying wiring (not shown), the semiconductor substrate 11, the gate of a MOS transistor (not shown), or the like and also connected to its upper metal wiring (not shown) formed on an insulation film 18.

The insulation film 18 is constituted of an insulator such as silicon oxide ($SiO_2$) and formed on the semiconductor substrate 11 so as to coat the metal wiring.

The stacked film 13 includes a metal film 13a and a thin film 13b formed on the metal film 13a. The metal film 13a is an alloy including aluminum as the principal ingredient and containing copper and silicon as appropriate. The thin film 13b has a single-layer structure of metal or a metal compound for protecting the metal film 13a and improving the reliability of the wiring or a multilayer structure of the above metal and metal compound. Titanium and tungsten are selected as the metal, while titanium nitride and tungsten silicide are selected as the metal compound. FIG. 6 shows an example of a multilayer structure of the thin film 13b including a titanium layer (Ti layer) 14 formed on the metal film 13a and a titanium nitride (TiN layer) 15 formed on the Ti layer 14.

The metal wiring of the stacked film 13 is formed by the steps shown in FIGS. 7A to 7E.

FIGS. 7A to 7E are cross-sectional views showing a method of carrying out metal wiring using a dry etching method according to a first embodiment of the present invention.

Figure 7A:
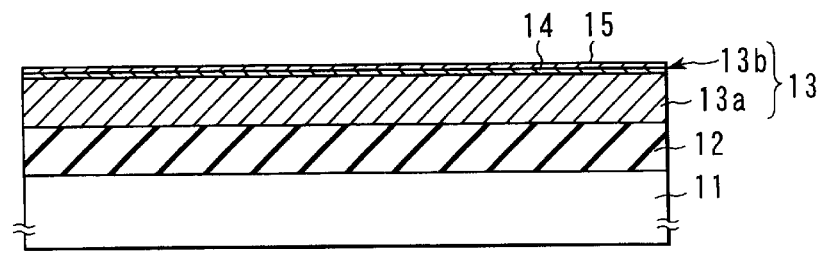
FIGS. 7A, 7B, 7C, 7D and 7E are cross-sectional views showing a method of forming metal wiring using a dry etching method according to a first embodiment of the present invention.

First, as illustrated in FIG. 7A, an insulation film is formed on a semiconductor substrate 11, and a metal film 13a containing aluminum as the base metal and a thin film 13b are sequentially stacked one on another on the insulation film 12 to form a stacked film 13. The thin film 13b includes a Ti layer 14 and a TiN layer 15.

Figure 2A:
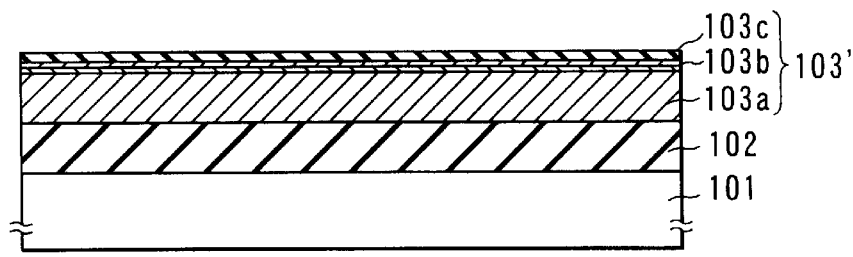
FIGS. 2A, 2B, 2C and 2D are cross-sectional views showing a method of forming prior art metal wiring.
Figure 2B:
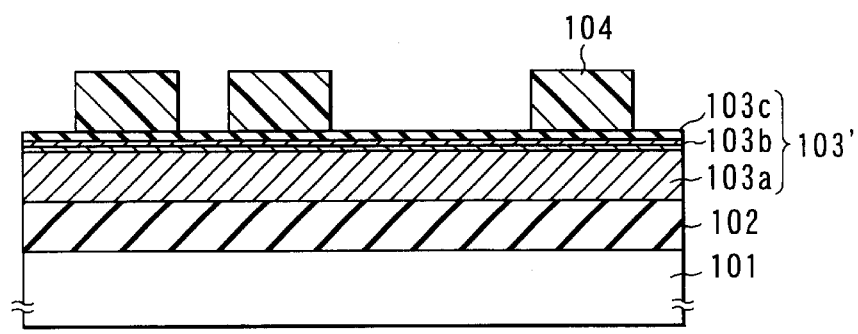
Figure 2C:
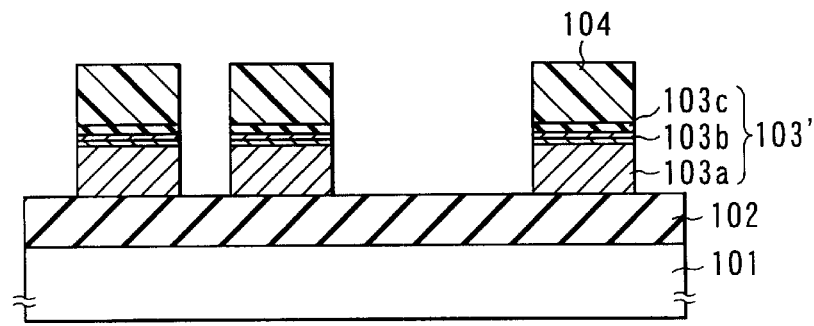
Figure 2D:
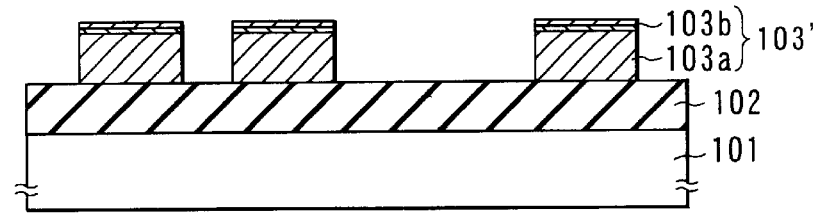
Figure 3A:
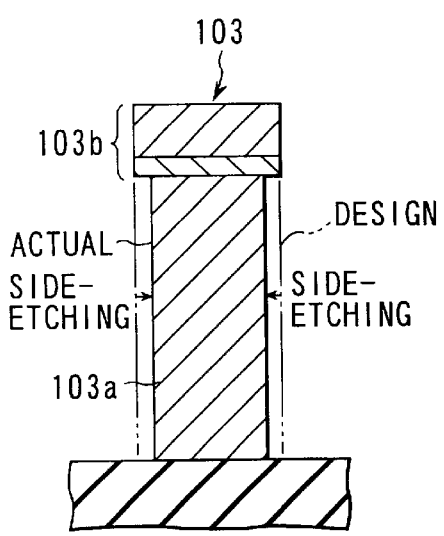
FIGS. 3A and 3B are cross-sectional views each showing prior art metal wiring.

Since the reflectivity of the Ti and TiN layers is low, they can serve as a reflection preventing film. Consequently, the conventional reflection preventing film 103c shown in FIG. 2A can be omitted. The first embodiment need not therefore include any reflection preventing films.

Figure 7B:
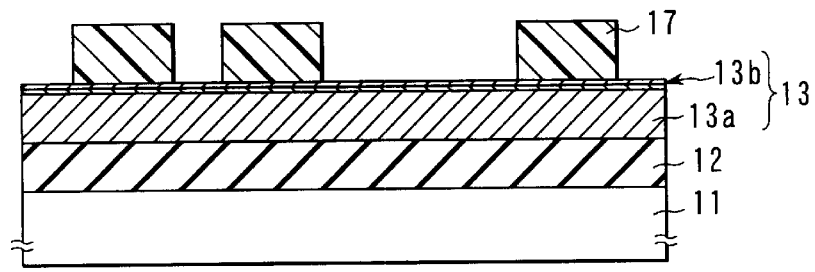

Then, as illustrated in FIG. 7B, photoresist is applied onto the stacked film 13 to form a photoresist film. Using an exposure technique, a pattern corresponding to the metal wiring is formed on the photoresist film. The photoresist film is developed to form a photoresist pattern 17 having a metal wiring pattern.

The structure shown in FIG. 7B is housed in the reaction treating chamber 10 of the dry etching apparatus shown in FIG. 5. Using the photoresist pattern 17 as a mask, the stacked film 13 is dry-etched.

Figure 7C:
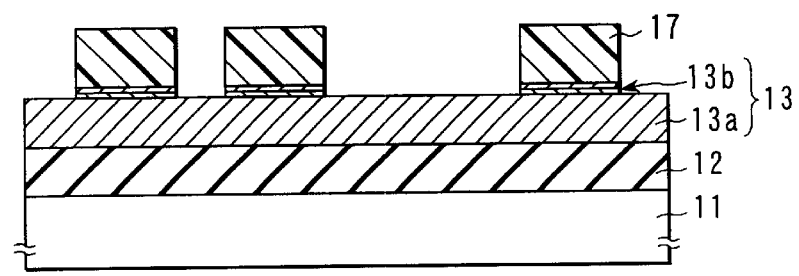

In the first embodiment, the thin film 13b is dry-etched using a first etching gas. The first etching gas has a gas composition in which the thin film 13b is etched almost vertically and the metal film 13a is hardly etched. The thin film 13b is thus etched almost vertically, as shown in FIG. 7C. Since the metal film 13a is hardly etched by the first etching gas, the dry etching of the stacked film 13 is stopped temporarily when the metal film 13a is exposed. The metal film 13a can thus be so constituted that it is hardly etched. For this reason, even though the etching rate of the thin film 13b is nonuniform within the plane of the semiconductor substrate (wafer), the etching becomes almost uniform all over the semiconductor substrate so as to expose the metal film 13a.

Figure 7D:
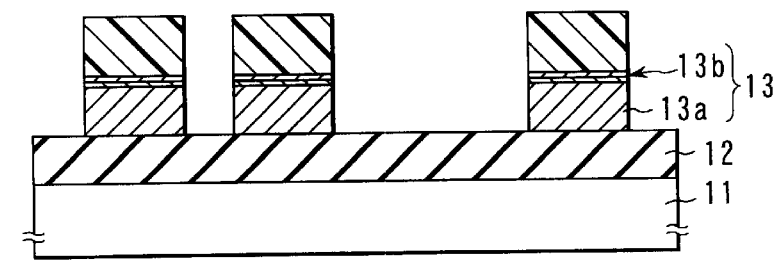

Next the first etching gas is switched to a second etching gas having a gas composition other than that of the first etching gas. The metal film 13a is dry-etched using the second etching gas. In the gas composition of the second etching gas, the metal film 13a is hardly side-etched but etched vertically. Therefore, as shown in FIG. 7D, the side-etching of the metal film 13a is decreased, with the result that the stacked film 13 is formed in the metal wiring pattern.

Figure 7E:
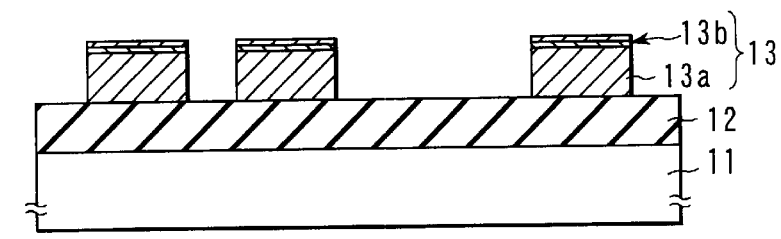

After that, as shown in FIG. 7E, the photoresist pattern is eliminated and thus the metal wiring of the stacked film 13 is completed. The structure shown in FIG. 6 is then obtained by depositing an insulation film 18 on the semiconductor substrate 11.

In the dry etching method according to the first embodiment described above, the thin film 13b is dry-etched using the first etching gas having a gas composition in which the thin film 13b is etched almost vertically and the metal film 13a is hardly etched. Even though the etching rate of the thin film 13b is nonuniform within the plane of the semiconductor substrate, the etching can be almost uniformed all over the semiconductor substrate such that the metal film 13a is exposed.

In this uniform etching condition, the metal film 13a is dry-etched using the second etching gas and thus it is hardly side-etched but etched vertically.

Figure 8:
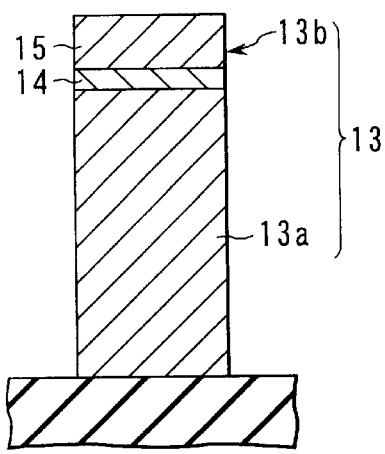
FIG. 8 is a cross-sectional view showing a shape of metal wiring formed by the dry etching method according to the first embodiment of the present invention.

The metal wiring of the stacked film 13, which includes the thin film 13b etched almost vertically and the metal film 13a decreased in side-etching, can thus be obtained as illustrated in FIG. 8.

Figure 4A:
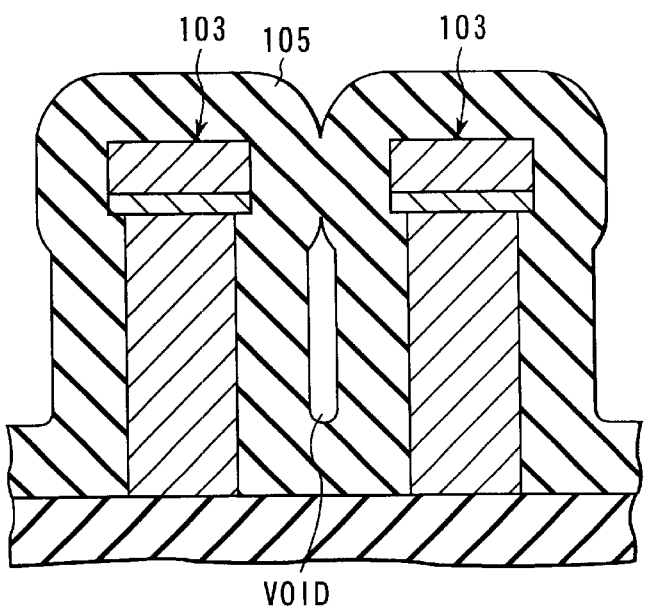
FIGS. 4A and 4B are views for explaining problems of prior art metal wiring.
Figure 9:
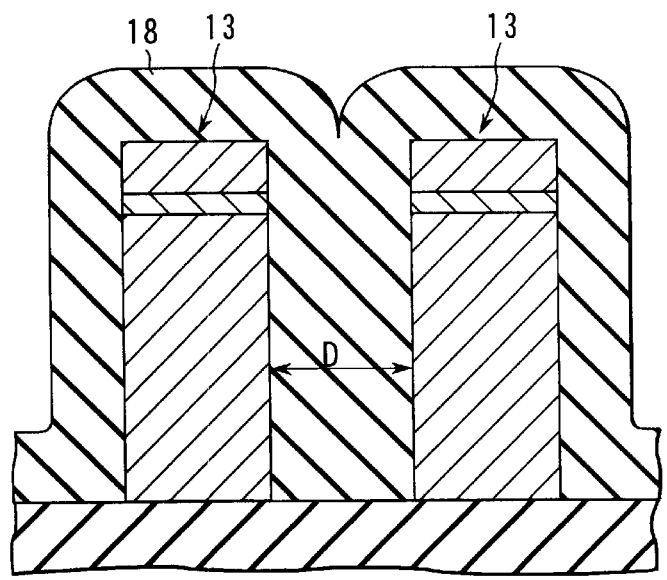
FIG. 9 is a view for explaining advantages of the metal wiring formed by the dry etching method according to the first embodiment of the present invention.

In the metal wiring (stacked film) 13 shown in FIG. 8, the thin film 13b does not overhang the metal film 13a. For this reason, a void as shown in FIG. 4A is hard to cause when an insulation film 18 is deposited as shown in FIG. 9. Since, moreover, the thin film 13b is not tapered by etching, a distance D between adjacent metal films becomes difficult to narrow as illustrated in FIG. 9. In the first embodiment, the metal wiring shown in FIG. 8 can be uniformed all over the semiconductor substrate.

An example of the first etching gas will now be described more specifically.

The first etching gas includes fluorine (F). In the above first embodiment, the thin film 13b contains titanium (Ti), while the metal film 13a contains aluminum (Al). First the titanium contained in the thin film 13b is combined with the fluorine into titanium fluoride, by which the thin film 13b is etched. If this etching advances to the metal film 13a, the aluminum contained in the metal film 13a is combined with the fluorine into aluminum fluoride. The aluminum fluoride is not vaporized but deposited on the metal film 13a, thereby preventing the metal film 13a from being etched. The metal film 13a on which the aluminum fluoride is deposited is not etched immediately after it is exposed to gas for etching metal containing aluminum as the base metal, such as chlorine gas.

The first etching gas can be constituted of a mixture of gas containing fluorine and gas containing chlorine. The use of such a mixture does not increase the etching rate of the thin film 13b.

If the percentage of chlorine gas in the mixture is large, aluminum is likely to be combined with chlorine into aluminum chloride to etch the metal film 13a before the aluminum fluoride is deposited on the metal film 13a. If the percentage of chlorine gas is so large, the metal film 13a will be side-etched.

In order to suppress the above situation, the number of atoms of chlorine contained in the mixture has only to be set smaller than that of atoms of fluorine. The mixture so regulated prevents aluminum contained in the metal film 13a from being combined with chlorine.

As a more specific example of the first etching gas, there is a mixture of chlorine gas ($Cl_2$ gas), argon gas (Ar gas), and carbon tetrafluoride gas ($CF_4$ gas). This mixture is introduced into the reaction treating chamber 10 of the dry etching apparatus illustrated in FIG. 5. For example, the $Cl_2$ gas, Ar gas, and $CF_4$ gas have flow rates of about 30 sccm, about 100 sccm, and 30 sccm or lower (favorably 10 sccm or higher and 30 sccm or lower), respectively.

If the stacked film 13 is dry-etched using the first etching gas as the above specific example where the internal pressure of the reaction treating chamber 10 is about 2 Pa and the temperature of the lower electrode 2 is about 40° C., the structure shown in FIG. 7C can be completed.

Figure 10:
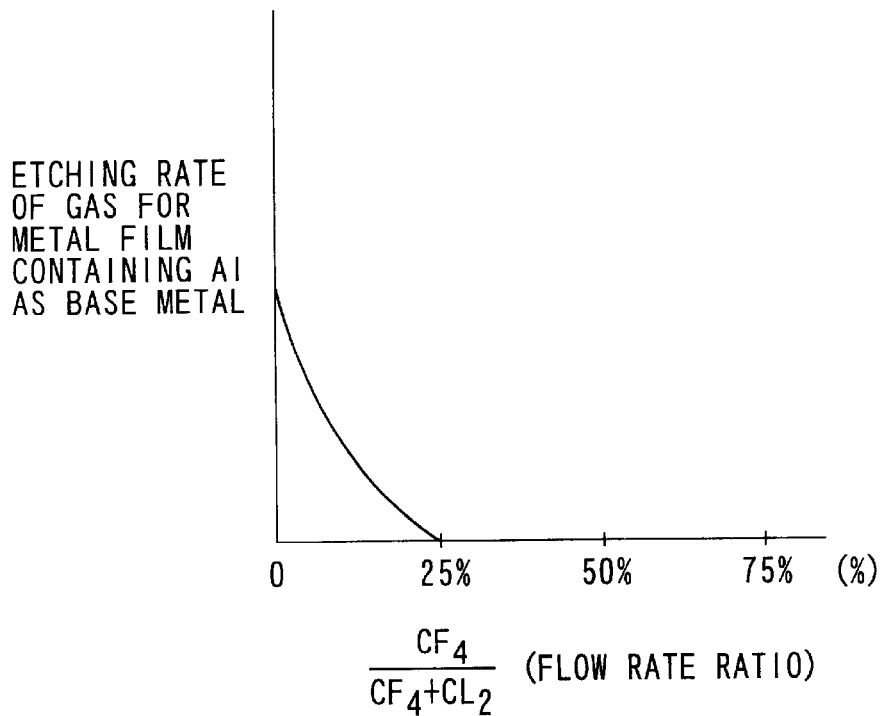
FIG. 10 is a graph showing a relationship between the etching rate of a metal film and the flow rate of $CF_4$ gas.

FIG. 10 is a graph showing the dependence of the etching rate of the metal film 13a on the flow rate percentage of $CF_4$ gas. In FIG. 10, an ordinate represents an etching rate (any unit) of the metal film 13a and an abscissa indicates a flow rate percentage of $CF_4$ ($CF_4/CF_4+Cl_2$)(%). In FIG. 10, the flow rate of $Cl_2$ gas is always set to 30 sccm.

As is apparent from FIG. 10, if the content of $CF_4$ is varied in the etching gas of $CF_4$ and $Cl_2$, the etching rate for etching the metal film 13a is varied markedly. In other words, when the flow rate percentage of $CF_4$ is 0%, the etching for the metal film 13a advances greatly; however, its etching rate decreases quickly as the flow rate percentage of $CF_4$ increases. The etching of the metal film 13a is essentially stopped when the flow rate percentage is about 25%, and this state continues when the percentage is 25% or higher.

Figure 3B:
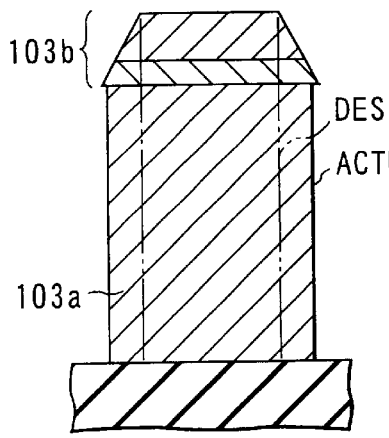

The second etching gas contains chlorine (Cl) gas and boron trichloride ($BCl_3$) gas, and the percentage of Cl gas is lowered to prevent the metal film 13a from being side-etched. The second etching gas can be replaced with the gas described in the Background of the Invention with reference to FIG. 3B, can be employed.

(Second Embodiment)

Figure 11A:
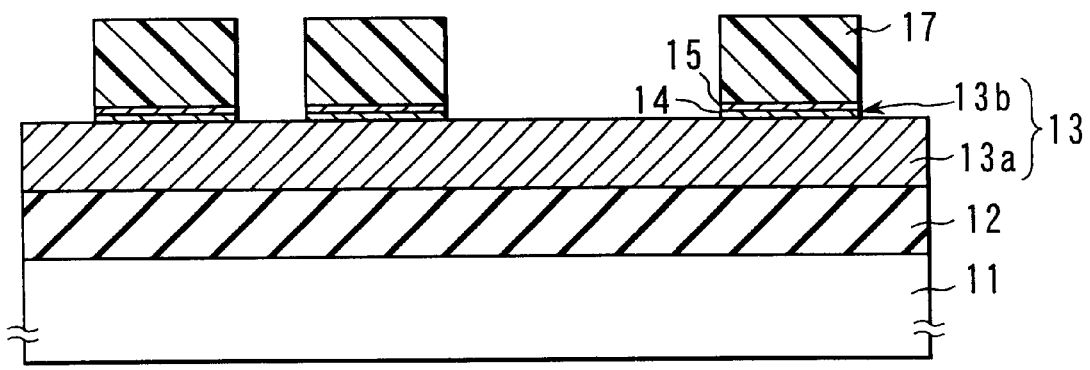
FIGS. 11A, 11B and 11C are cross-sectional views showing a method of forming metal wiring using a dry etching method according to a second embodiment of the present invention.
Figure 11B:
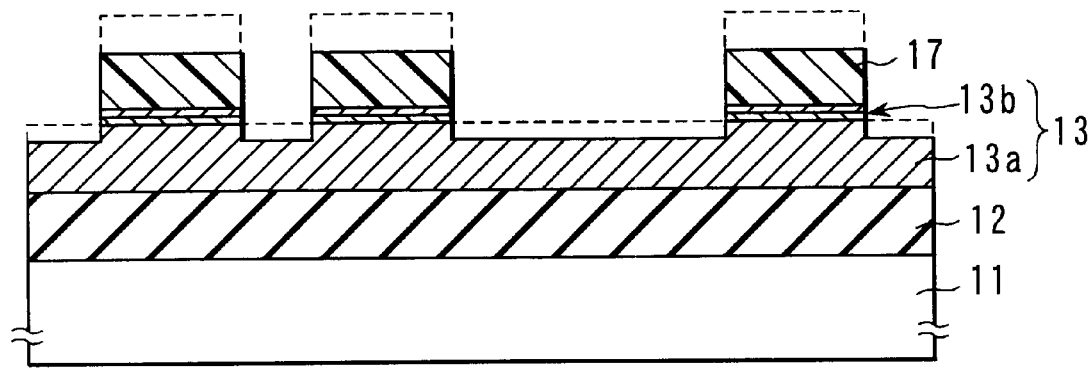
Figure 11C:
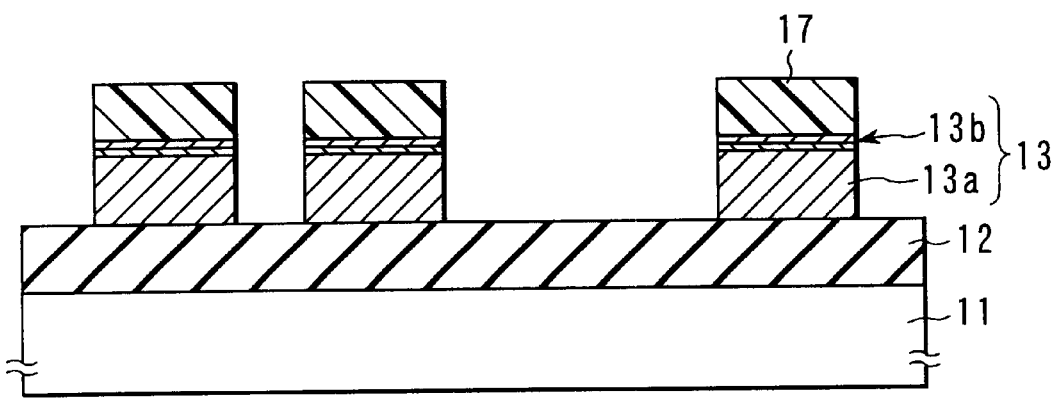

FIGS. 11A to 11C are cross-sectional views showing a method of forming metal wiring using a dry etching method according to a second embodiment of the present invention.

First the structure as shown in FIG. 11A is obtained by the method described above with reference to FIGS. 7A to 7C.

Then the first etching gas in the first embodiment is switched to the second etching gas therein to dry-etch a metal film 13a. In the second embodiment, the dry etching is performed by switching a small selective ratio of photoresist to a large selective ratio thereof partway. When the selective ratio is small, gas containing fluorine (F), e.g., $CF_4$ gas, is mixed into the second etching gas. In this etching gas, the number of atoms of fluorine is smaller than that of atoms of chlorine. If the metal film 13a is dry-etched using such an etching gas, a photoresist pattern 17 is etched more greatly than the metal film 13a, as illustrated in FIG. 11B.

When the selective ratio of photoresist is large, the second etching gas of the second embodiment is considered to be the same as that of the first embodiment. If the metal film 13a is dry-etched using the second etching gas, the structure as shown in FIG. 11C is completed.

In the second embodiment, as described above, the metal film 13a is dry-etched by switching the small selective ratio of photoresist to the large selective ratio thereof partway. Therefore, in the step of FIG. 11B, the constituting materials fly out of the photoresist pattern 17. These materials serve as a so-called source of a sidewall protection film for suppressing the side-etching of the metal film 13a. For this reason, the dry etching of the metal film 13a advances particularly in the initial stage so as to form the sidewall protection film on the sidewall of the metal film 13a.

According to the second embodiment described above, a slight undercut of the metal film 13a can be prevented from occurring near the interface between the metal film 13a and thin film 13b.

If gas including fluorine is mixed into the etching gas used when the selective ratio of photoresist is small, the dry etching of the metal film 13a advances particularly in its initial stage such that aluminum fluoride is formed further on the sidewall of the metal film 13a. Thus, the advantage of suppressing the above slight undercut can be made greater.

(Third Embodiment)

Figure 12A:
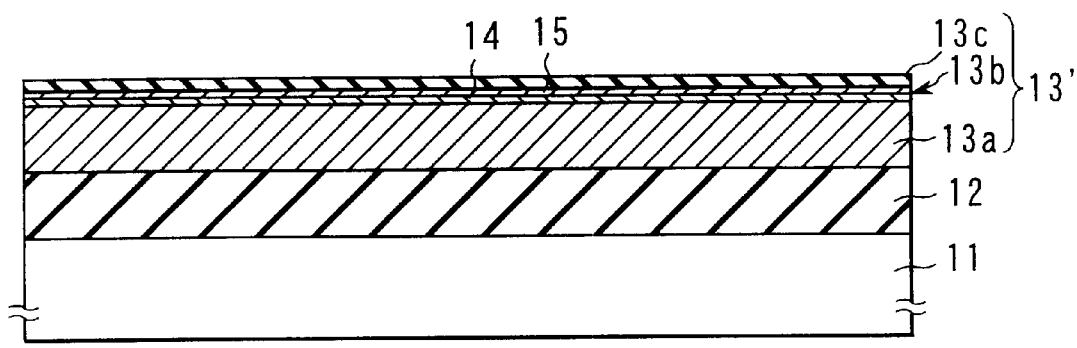
FIGS. 12A, 12B and 12C are cross-sectional views showing a method of forming metal wiring using a dry etching method according to a third embodiment of the present invention.
Figure 12B:
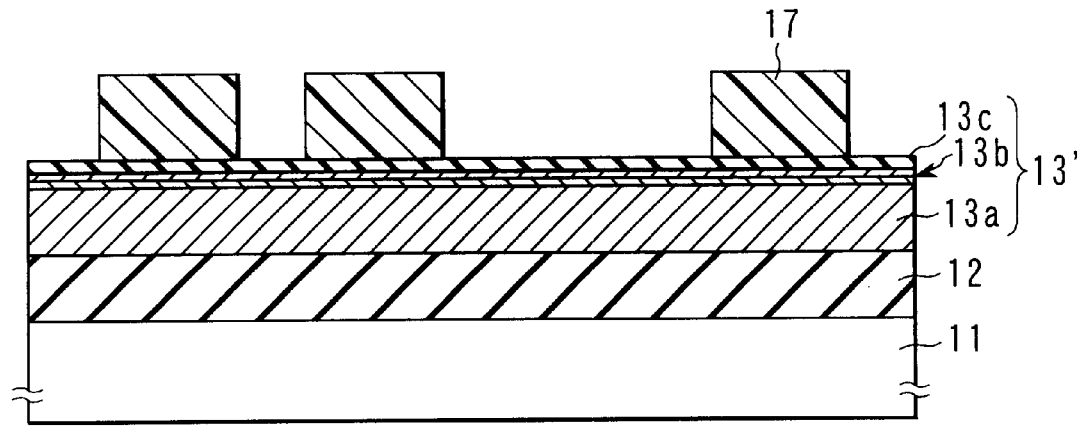
Figure 12C:
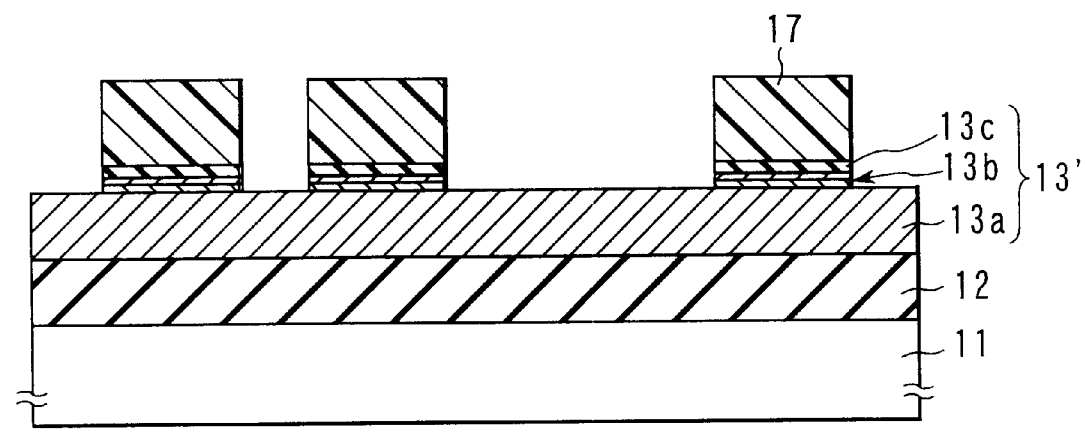

FIGS. 12A to 12C are cross-sectional views showing a method of forming metal wiring using a dry etching method according to a third embodiment of the present invention.

First, as illustrated in FIG. 12A, an insulation film 12 is formed on a semiconductor substrate 11, and a metal film 13a including aluminum as the base metal, a thin film 13b, and a reflection preventing film 13c are sequentially stacked one on another on the insulation film 12 to form a stacked film 13'. The thin film 13b includes a Ti layer 14 and a TiN layer 15. The reflection preventing film 13c is formed of an organic compound film containing carbon.

Next, as shown in FIG. 12B, photoresist is applied onto the stacked film 13' to form a photoresist film. Using an exposure technique, a pattern corresponding to the metal wiring is formed on the photoresist film. The photoresist film is developed to form a photoresist pattern 17 having a metal wiring pattern.

The structure shown in FIG. 12B is housed in the reaction treating chamber 10 of the dry etching apparatus illustrated in FIG. 5. The stacked film 13' is dry-etched using the photoresist pattern 17 as a mask.

Then, the reflection preventing film 13c and thin film 13b are dry-etched using a first etching gas.

The first etching gas has a gas composition in which the reflection preventing film 13c and thin film 13b are etched almost vertically and the metal film 13a is hardly etched. As shown in FIG. 12C, therefore, the reflection preventing film 13a and thin film 13b are etched almost vertically. Since the metal film 13a is hardly etched by the first etching gas, the dry etching of the stacked film 13' is stopped temporarily when the metal film 13a is exposed. The metal film 13a can thus be so constituted that it is hardly etched.

After that, the method according to the first or second embodiment has only to be employed.

When the stacked film 13' includes the metal film 13a, thin film 13b and reflection preventing film 13c, both the films 13b and 13c have only to be dry-etched using the first etching gas.

Figure 13:
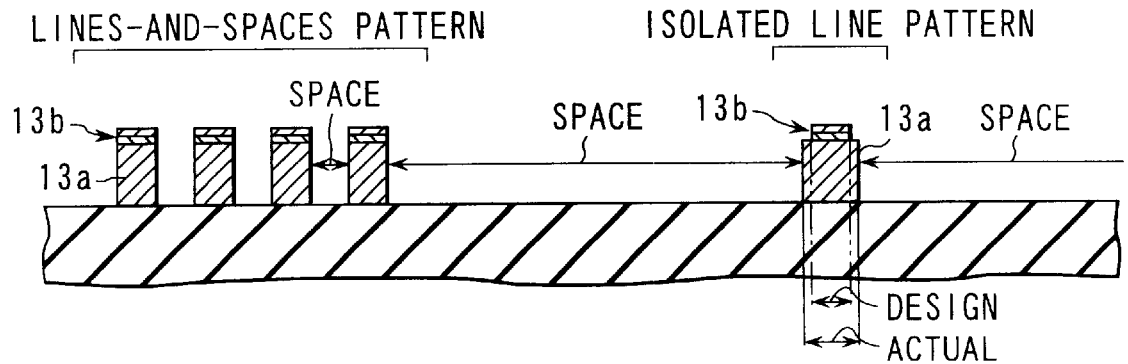
FIG. 13 is a cross-sectional view showing a shape of metal wiring formed by the dry etching method according to the one of the first to third embodiment of the present invention.

As shown in FIG. 13, the metal wiring formed in the foregoing first to third embodiments has a favorable shape, especially in a very fine lines-and-spaces (L/S) pattern region.

Figure 14A:
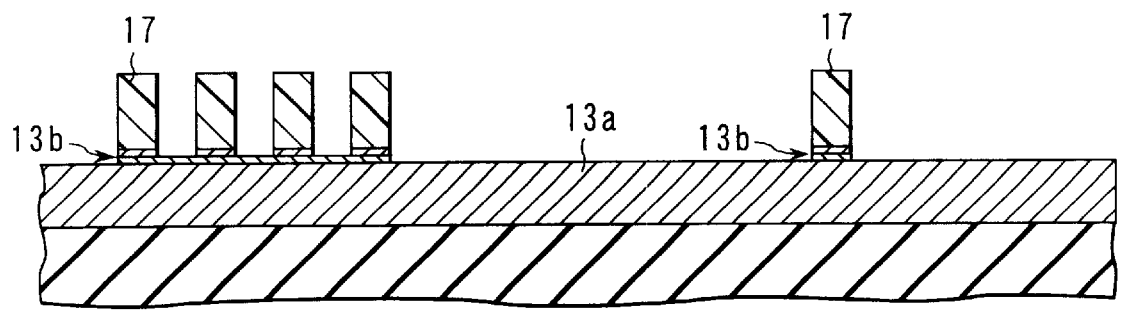
FIGS. 14A and 14B are a cross-sectional view showing a shape of metal wiring during a thin film processing.

However, as shown in FIG. 14A, the thin film 13b in an isolated line pattern region is etched more quickly than that in the L/S pattern region by the micro-loading effect. Therefore, the etching stops in the metal film 13a in the isolated line pattern region longer than that in the L/S pattern region.

Figure 14B:
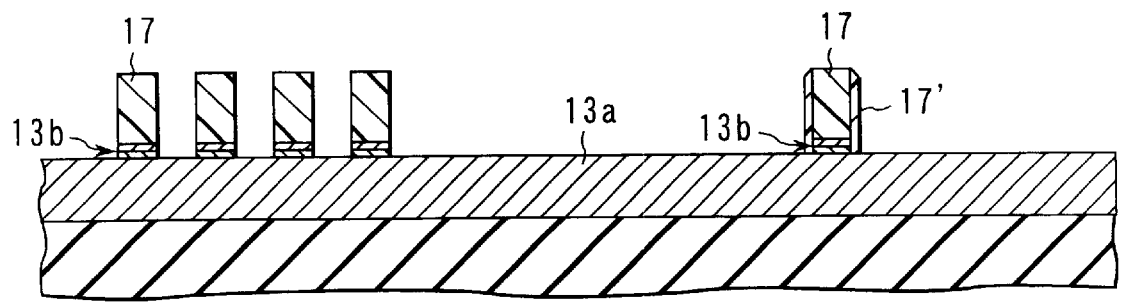

Consequently, as illustrated in FIG. 14B, a decomposed object 17' of resist is deposited on the sidewall of the photoresist pattern 17 in the isolated line pattern region when the etching of the thin film 13b is completed.

If a decomposed object 17' is deposited, the metal wiring in the isolated line pattern region becomes wider than the design value, as shown FIG. 13.

Figure 4B:
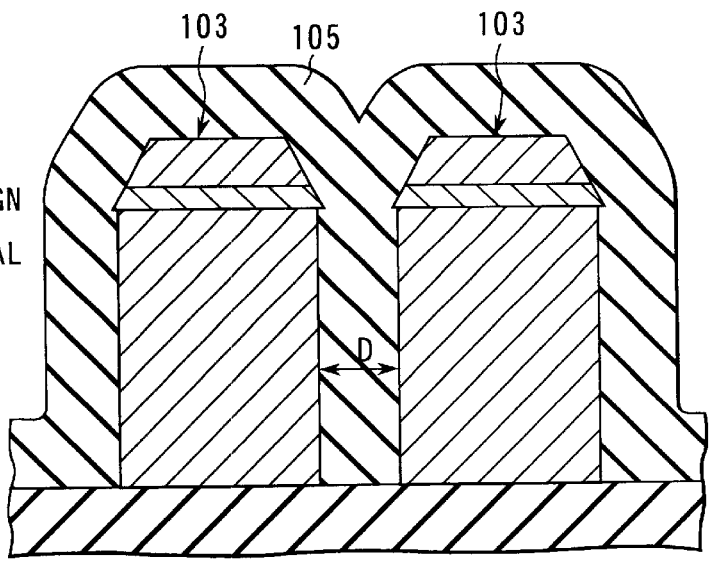

Since, however, the isolated line pattern region has an adequate space, the problems as described with reference to FIGS. 4A and 4B do not occur.

Taking it into consideration that the metal wiring is increased in size, the size of the photoresist pattern 17 in the isolated line pattern region is adjusted in advance. Thus, the metal wiring in the isolated line pattern region can be formed in the same size as that of the metal wiring in the L/S pattern region.

According to the first to third embodiments described above, there can be provided a dry etching method capable of patterning a stacked film of a metal film and a thin film, which includes metal or a metal compound and is formed on the metal film, in such a manner that the thin film is formed vertically and the metal film is prevented from being side-etched.

(Fourth Embodiment)

The first to third embodiments are each directed to a method of dry etching a stacked film of both a metal film containing aluminum as the base metal and metal, a metal compound, or a thin film having a stacked structure of metal and metal compound, which is formed on the top of the metal film.

The fourth embodiment is directed to a method of dry etching a stacked film of a metal film containing aluminum as the base metal and a thin film formed on the underside of the metal film. Hereinafter this thin film is referred to as a barrier layer.

Figure 15:
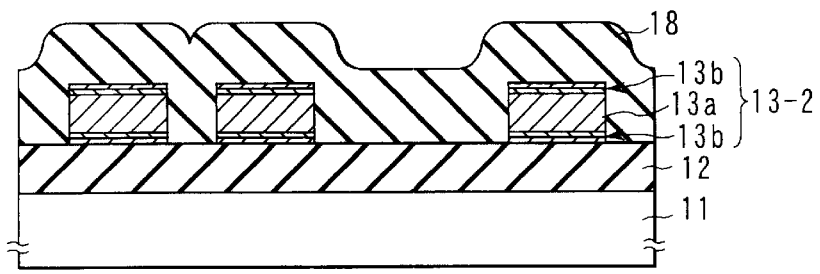
FIG. 15 is a cross-sectional view of a semiconductor substrate on which metal wiring is formed.

FIG. 15 is a cross-sectional view of a semiconductor substrate on which metal wiring is formed.

The structure shown in FIG. 15 differs from that shown in FIG. 6 in that a barrier layer 13*d* is formed between an insulation film 12 and a metal film 13*a*. The metal wiring of the fourth embodiment is therefore constituted of a stacked film 13-2 of the barrier layer 13*d*, metal film 13*a* and thin film 13*b*.

Like in the first and second embodiments, the metal film 13*a* is an alloy including aluminum as the principal ingredient and containing copper and silicon as appropriate. Similarly, the thin film 13*b* has a single-layer structure of metal or a metal compound for protecting the metal film 13*a* and improving the reliability of the wiring, or a multilayer structure of the above metal and metal compound.

The barrier layer 13*d* prevents the aluminum included in the metal film 13*a* from reacting on the metal wiring and semiconductor substrate 11 when the metal wiring is bonded to its lower wiring and the substrate 11. The barrier layer 13*d* therefore has a single-layer structure of metal such as titanium or a metal compound such as titanium nitride or a multilayer structure of the above metal and metal compound.

Conventionally the metal wiring of the stacked film 13-2 is formed by the steps illustrated in FIGS. 16A to 16D.

Figure 16A:
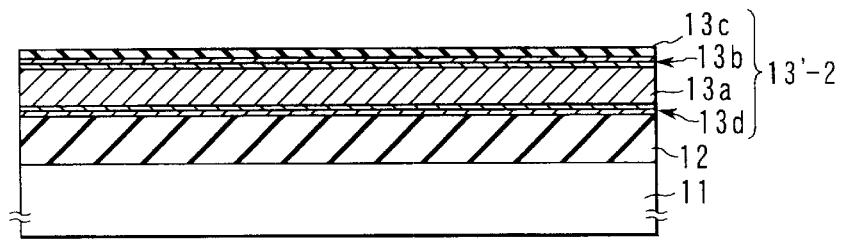
FIGS. 16A, 16B, 16C and 16D are cross-sectional views showing a prior art method of forming metal wiring.

First, as shown in FIG. 16A, an insulation film 12 is formed on a semiconductor substrate 12, and a barrier layer 13*d*, a metal film 13*a*, a thin film 13*b* and a reflection preventing film 13*c* are stacked one on another on the insulation film 12 to form a stacked film 13'-2.

Figure 16B:
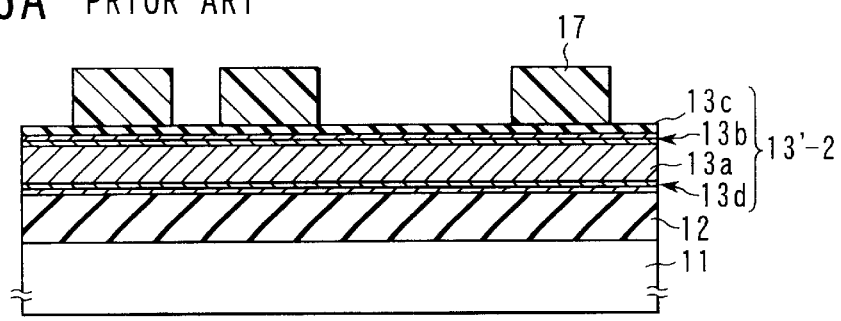

Next, as illustrated in FIG. 16B, photoresist is applied onto the reflection preventing film 13*c* to form a photoresist film. Using an exposure technique, a pattern corresponding to the metal wiring is formed on the photoresist film. This photoresist film is developed to form a photoresist pattern 17 having a metal wiring pattern.

Figure 16C:
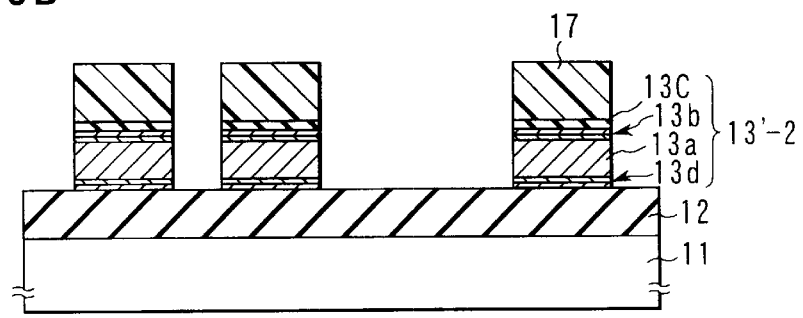

Then, the stacked film 13'-2 is dry-etched using the photoresist pattern 17 as a mask, as shown in FIG. 16C.

Figure 16D:
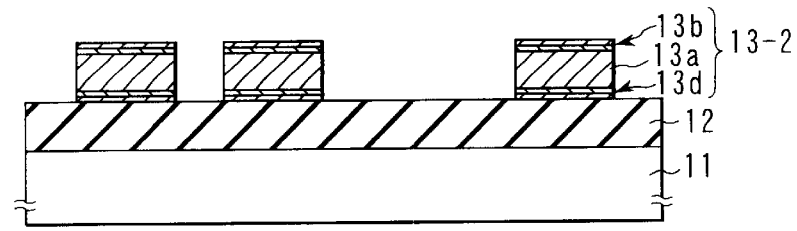

As illustrated in FIG. 16D, the photoresist pattern 17 and reflection preventing film 13*c* are removed to form metal wiring of a stacked film 13-2 including the barrier layer 13*d*, metal film 13*a* and thin film 13*b*. After that, an insulation film 18 is deposited on the semiconductor substrate 11 as shown in FIG. 15.

The metal wiring of the stacked film 13-2 is thus formed by patterning the stacked film 13'-2 including the barrier layer 13*d*, metal film 13*a*, thin film 13*b*, and reflection preventing film 13*c*. For this reason, these different metal films have to be processed continuously at the time of dry etching for the patterning.

In accordance with a recent increase in degree of integration of semiconductor devices, miniaturization of metal wiring has been demanded. Specifically, high-precision processing has been required to decrease wiring portions in size and narrow an interval between them. The problem is a difference in mask size, wiring size, and wiring-to-wiring interval between processing before and after. This difference is generally called a pattern transfer difference.

Usually the width of a processed wiring portion becomes larger than that of a mask when a mask pattern (photoresist pattern 17) is formed on the stacked film 13-2 and then the stacked film 13-2 is processed by the dry etching method. In this case, it is likely that an interval between wiring portions will be narrowed and a short circuit will be caused easily between them. It is also likely that the wiring capacitance will increase and the device characteristics will deteriorate.

In order to resolve the above problems, conventionally, a pattern transfer difference was measured in advance, and part of wiring was thinned only by the measured pattern transfer difference by controlling an amount of light exposure when a mask was formed, or an exposure mask was formed in advance taking into consideration the pattern transfer difference.

Even the above method can sufficiently be applied to conventional semiconductor devices which are not miniaturized. However, it is now difficult to apply it to recent semiconductor devices which are miniaturized. Even though a semiconductor device is increased in packaging density and its miniaturization is desired, the wiring cannot be thinned because its resistance is increased and accordingly the mask pattern (photoresist pattern) cannot be reduced in thickness. Consequently, the mask is narrowed and the aspect ratio (the ratio of mask height to mask width) is increased. If the aspect ratio increases, a phenomenon will occur in which the mask pattern is easy to physically fall when it is washed after development.

If, moreover, the pattern transfer difference, which is caused at the time of dry etching, is corrected by the mask pattern, the aspect ratio will be increased further and the mask pattern will be much easier to fall. The causes of the pattern transfer difference are that the metal film 13*a* is tapered and the processed barrier layer 13*d* is shaped such that its bottom expands.

The vertical processing of the metal film 13*a* can be attained by optimizing processing conditions, gas composition, pressure, temperature, and the like. Under the present circumstances, however, it is difficult to process the barrier layer 13*d* underlying the metal film 13*a* in accordance with a mask size.

The fourth embodiment aims at providing a dry etching method capable of etching a stacked film including a barrier layer 13*d* and a metal film 13*a* formed on the barrier layer 13*d* so as to reduce in pattern transfer difference.

The inventors of the present invention conducted the following experiment in order to know how the bottom of the barrier layer 13*d* expanded.

FIG. 17 is a table showing results of the experiment. In this experiment, a stacked film 13-3 was dry-etched using a photoresist pattern 17-3 as a mask, and the mask sizes were measured in the respective steps. The stacked film 13-3 includes a TiN/Ti film serving as a barrier layer 13d, an Al—Cu film (Cu content of 1 wt %) serving as a metal film 13a containing aluminum as the base metal, and a TiN film serving as a reflection preventing film 13c. A mixture of $Cl_2+BCl_3$ was used as an etching gas.

It turned out from the experiment that mask size S hardly varied during the processing of Al—Cu film (during the processing of Al, i.e., state b) but changed abruptly after an Al end-point indicating the completion of processing of Al—Cu film, as shown in FIG. 17. The Al end-point was set where the monitored 261-nm light emission intensity of plasma was decreased to 80% of the maximum. In other words, the processing of part of an Al—Cu film on a semiconductor substrate to be processed had been completed when the Al end-point was detected, but the processing of the remaining part had not been completed (state c). In dry etching, usually, a micro-loading effect is produced, and the etching rate in no wiring lines is higher than that in plural wiring lines, and the processing of an Al—Cu film in the plural wiring lines is not been completed when an Al end-point is detected. In this experiment, the etching is finished after a lapse of 61 seconds after the Al end-point (state e).

The inventors checked a variation in resist film thickness H in each etching step in order to find a reason for which the mask size was increased after the end point is detected. Results of this are also shown in FIG. 17.

It also turned out that the retreat speed of the mask was raised after the Al end-point. Therefore, it turned out that the bottom of barrier layer 13d expanded for the following reason.

In the vicinity of the Al end-point, the processing of part of the Al—Cu film is completed and the barrier layer 13d is exposed. After that, the processing area of the Al—Cu film is decreased and thus the Cl gas (activated species) to be consumed for processing the Al—Cu film is left and the etching rate of photoresist is increased. The etched photoresist is exhausted in the form of $CCl_4$; however, it is decomposed again in plasma and deposited on the semiconductor substrate to be treated or on the mask. The decomposed objects deposited on the top and sidewall of the mask are etched by ions. The etching rate at which the decomposed object is removed by etching from the sidewall of the mask is lower than the speed at which the decomposed object is deposited thereon. It is thus thought that the mask size is increased. This tendency becomes more conspicuous after the processing of the barrier layer 13d and the exposure of an oxide film 12-3.

With a view to eliminating a decomposed object of resist from the sidewall of the mask, oxygen was added to the etching gas after the Al end-point. The mask sizes S were then obtained as shown in FIG. 18.

Figure 18:
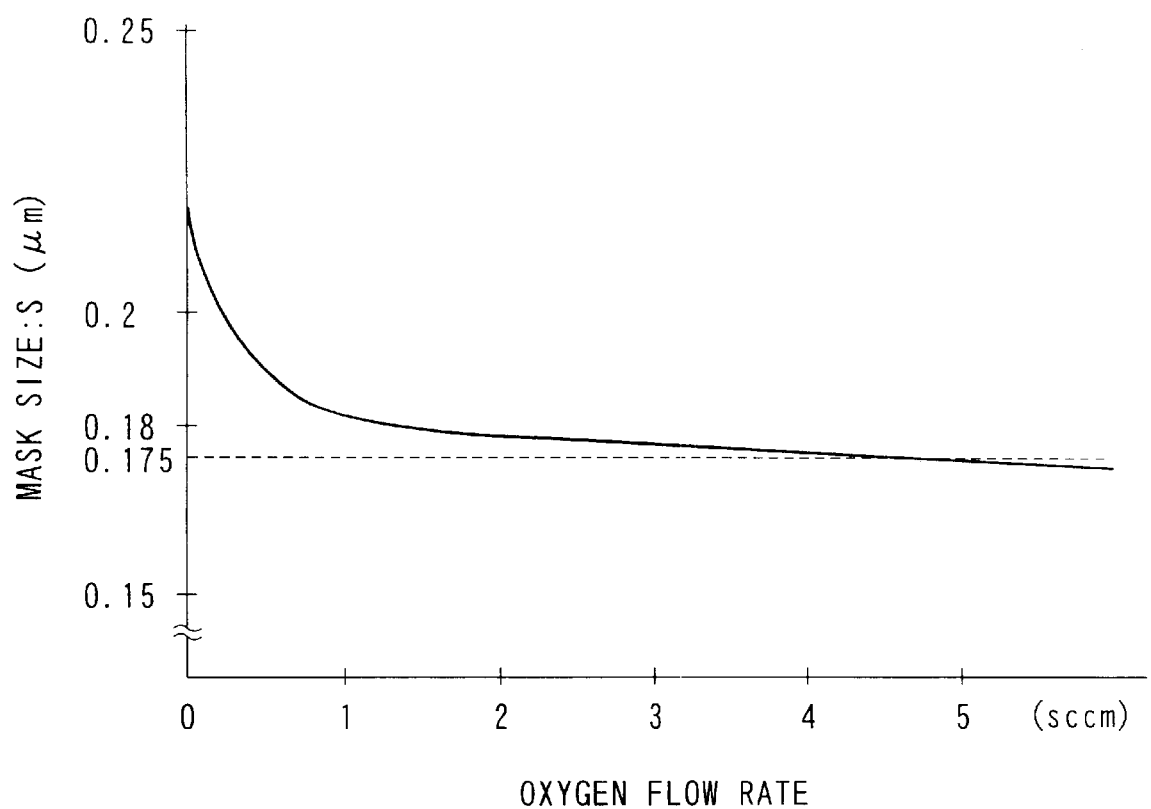
FIG. 18 is a graph showing a relationship between the flow rate of oxygen and mask size S.

FIG. 18 is a graph showing a relationship between the flow rate of oxygen added to the etching gas after the Al end-point and the mask size S. In FIG. 18, the ordinate indicates the mask size S ($\mu$m), and the abscissa represents the flow rate (sccm) of oxygen added to the etching gas.

It turned out from FIG. 18 that mask size S was prevented from increasing as the oxygen flow rate increases. The advantage that the addition of oxygen of 2 sccm or more could cause the mask size S to be substantially reduced to the original size (0.175 $\mu$m), was confirmed.

In the above case, oxygen was added after the Al end-point. When oxygen was added from the beginning, the mask size S was not decreased. The reason is as follows. If an amount of oxygen to be added is small, the oxygen does not contribute to the etching of deposits and most oxygen contributes to scavenging of carbon caused by re-decompression of photoresist in plasma.

If, however, the amount of oxygen is increased to, e.g., 5 sccm or more, the mask size S starts to decrease. In other words, oxygen can be added from the beginning if the amount of oxygen to be added is larger than a given limit.

It was confirmed that the same effect could be produced even though carbon monoxide (CO) and carbon dioxide ($CO_2$) as well as oxygen ($O_2$) were used as an additive for reducing the mask size S. The carbon monoxide and carbon dioxide have the advantage that the flow rate can be controlled more easily than that of oxygen since the mask size S is not varied greatly.

On the contrary, oxygen has the advantage that the mask size S can be controlled by a small amount thereof since it varies the mask size S more greatly than the carbon monoxide and carbon dioxide.

A more specific example will now be described as a fourth embodiment of the present invention.

FIGS. 19A to 19D are cross-sectional views showing a method of carrying out metal wiring using a dry etching method according to the fourth embodiment of the present invention.

Figures 19A, 19B:
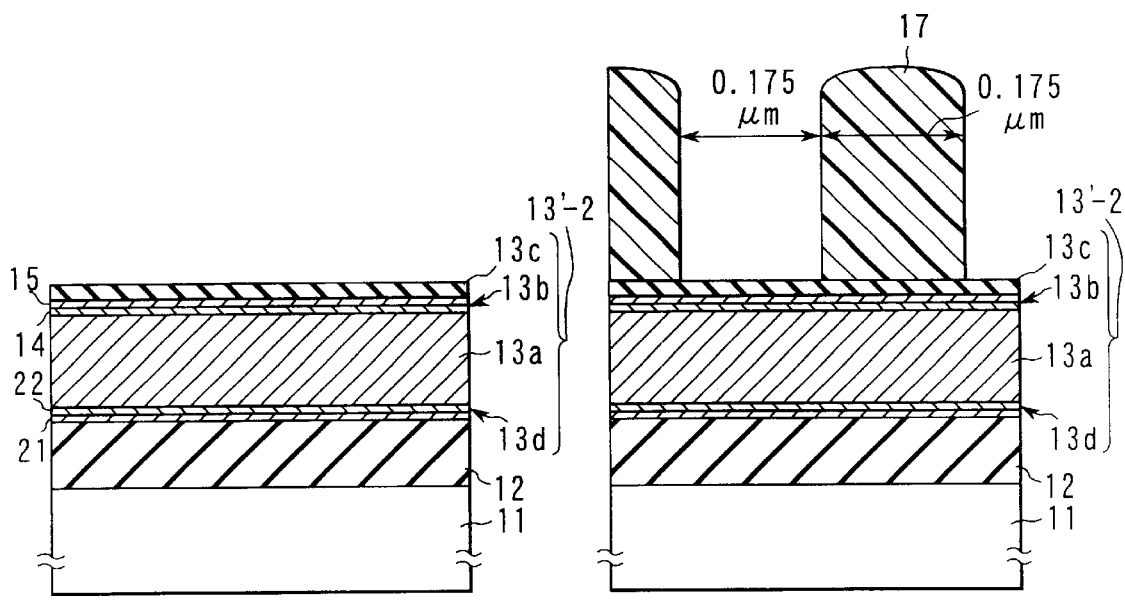
FIGS. 19A, 19B, 19C and 19D are cross-sectional views showing a method of forming metal wiring using a dry etching method according to a fourth embodiment of the present invention.
Figures 19C, 19D:
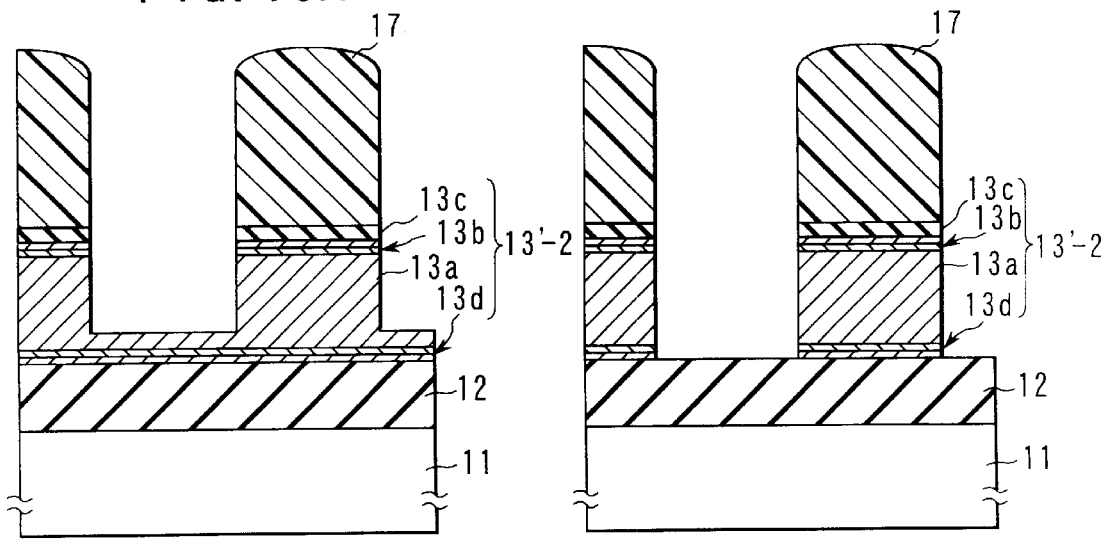

Referring first to FIG. 19A, an insulation film 12 is formed on a semiconductor substrate 11. The insulation film 12 is constituted of silicon oxide ($SiO_2$) and its surface is planarized. A barrier layer 13d is formed on the insulation film 12. The barrier layer 13d has a stacked structure of a Ti film 21 formed on the insulation film 12 and having a thickness of about 10 nm and a TiN film 22 formed on the Ti film 21 and having a thickness of about 40 nm. A metal film 13a is formed on the barrier layer 13d. The metal film 13a is constituted of an alloy formed on the TiN film 22 and having a thickness of about 330 nm. The alloy includes aluminum as the base metal and contains copper (Cu) of about 1 wt%. A thin film 13b is formed on the metal film 13a. The thin film 13b has a stacked structure of a Ti film 14 formed on the metal film 13a and having a thickness of 10 nm and a TiN film 15 formed on the Ti film 14 and having a thickness of 50 nm. A reflection preventing film 13c is formed on the thin film 13b. The reflection preventing film 13c is constituted of a carbon-containing organic compound. Thus, a stacked film 13'-2 of the barrier layer 13d, metal film 13a, thin film 13b, and reflection preventing film 13c is formed on the insulation film 12.

As illustrated in FIG. 19B, photoresist is applied onto the reflection preventing film 13c to form a photoresist film. Using an exposure technique, a pattern corresponding to the metal wiring is formed on the photoresist film. The photoresist film is developed to form a photoresist pattern 17 having a metal wiring pattern. As the pattern size of the fourth embodiment, the wiring line and space are both 0.175 $\mu$m.

The structure shown in FIG. 19B is housed in the reaction chamber 10 of the dry etching apparatus shown in FIG. 5. Using the photoresist pattern 17 as a mask, the stacked film 13'-2 is dry-etched.

In the fourth embodiment, the stacked film 13'-2 is etched in two steps, i.e., before the Al end-point (main etching) and after the Al end-point (over-etching). The Al end-point is set where monitored 261-nm light emission intensity of plasma is decreased to 80% of the maximum. In this Al end-point, as described above, the processing of part of the metal film 13a is completed, but that of the remaining part thereof is not completed.

In the main etching, a mixture of $Cl_2$, $BCl_3$ and $N_2$ is employed as an etching gas. The ratio of $Cl_2/BCl_3/N_2$ is, for example, 80/70/5 sccm. As an etching condition, pressure is 12 mTorr, substrate treatment temperature is 35° C., power applied to a coil 1 is 500W, and bias power applied to a lower electrode 2 is 350W. The main etching is thus completed to obtain the structure shown in FIG. 19C.

In the over-etching, a mixture of $Cl_2$, $BCl_3$, $N_2$ and $O_2$ is employed as an etching gas. The ratio of $Cl_2/BCl_3/N_2/O_2$ is, for example, 60/40/5/2 sccm. As an etching condition, pressure is 12 mTorr, substrate treatment temperature is 35° C., power applied to a coil 1 is 350W, and bias power applied to the lower electrode 2 is 200W. Thus, oxygen ($O_2$) of 2 sccm is added to the etching gas used for the over-etching. The over-etching is completed to obtain the structure shown in FIG. 19D.

Figure 20:
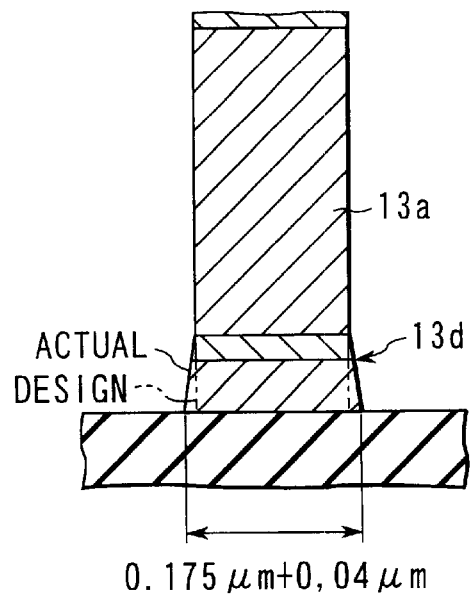
FIG. 20 is a cross-sectional view showing a shape of metal wiring formed by the dry etching method according to the fourth embodiment of the present invention.

A section of metal wiring formed by the dry etching method according to the above fourth embodiment, is illustrated in FIG. 20.

Referring to FIG. 20, the barrier layer 13d is simply increased about 0.04 μm (0.02 μm in each of right and left directions) from the mask size S (0.175 μm).

Next a comparative example will be described in order to explain the advantage of the present invention.

The comparative example differs from the method according to the fourth embodiment particularly in that oxygen ($O_2$) is not added to the etching gas used for the over-etching.

The etching gas and etching condition for the main etching of the comparative example are the same as those of the fourth embodiment.

In the over-etching, a mixture of $Cl_2/BCl_3/N_2$ of 60/40/5 sccm is employed. As an etching condition, pressure is 12 mTorr, substrate treatment temperature is 35° C., power applied to a coil is 350W, and bias power applied to the lower electrode is 200W.

Figure 21:
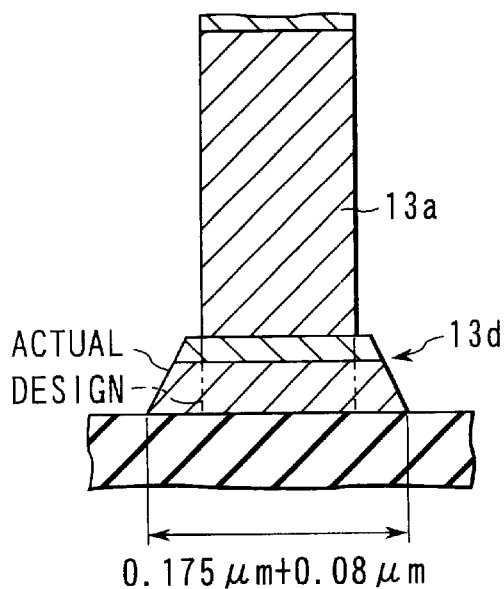
FIG. 21 is a cross-sectional view showing a shape of metal wiring formed by a dry etching method according to a comparative example.

A section of metal wiring formed by the dry etching method according to the comparative example, is illustrated in FIG. 21.

Referring to FIG. 21, the barrier layer 13d is simply increased about 0.08 μm (0.04 μm in each of right and left directions) from the mask size S (0.175 μm).

The dry etching method according to the fourth embodiment allows a pattern transfer difference to decrease to 0.02 μm in each of right and left directions. It is thus possible to suppress the phenomenon in which the processed barrier layer 13d is shaped such that its bottom expands.

(Fifth Embodiment)

A fifth embodiment of the present invention is directed to a method of dry etching a stacked film of a barrier layer, a metal film formed on the barrier layer and containing aluminum as the principal ingredient, and a thin film formed on the metal film.

FIGS. 22A to 22D are cross-sectional views showing a method of carrying out metal wiring employing a dry etching method according to the fifth embodiment of the present invention.

Figures 22A, 22B, 22C, 22D:
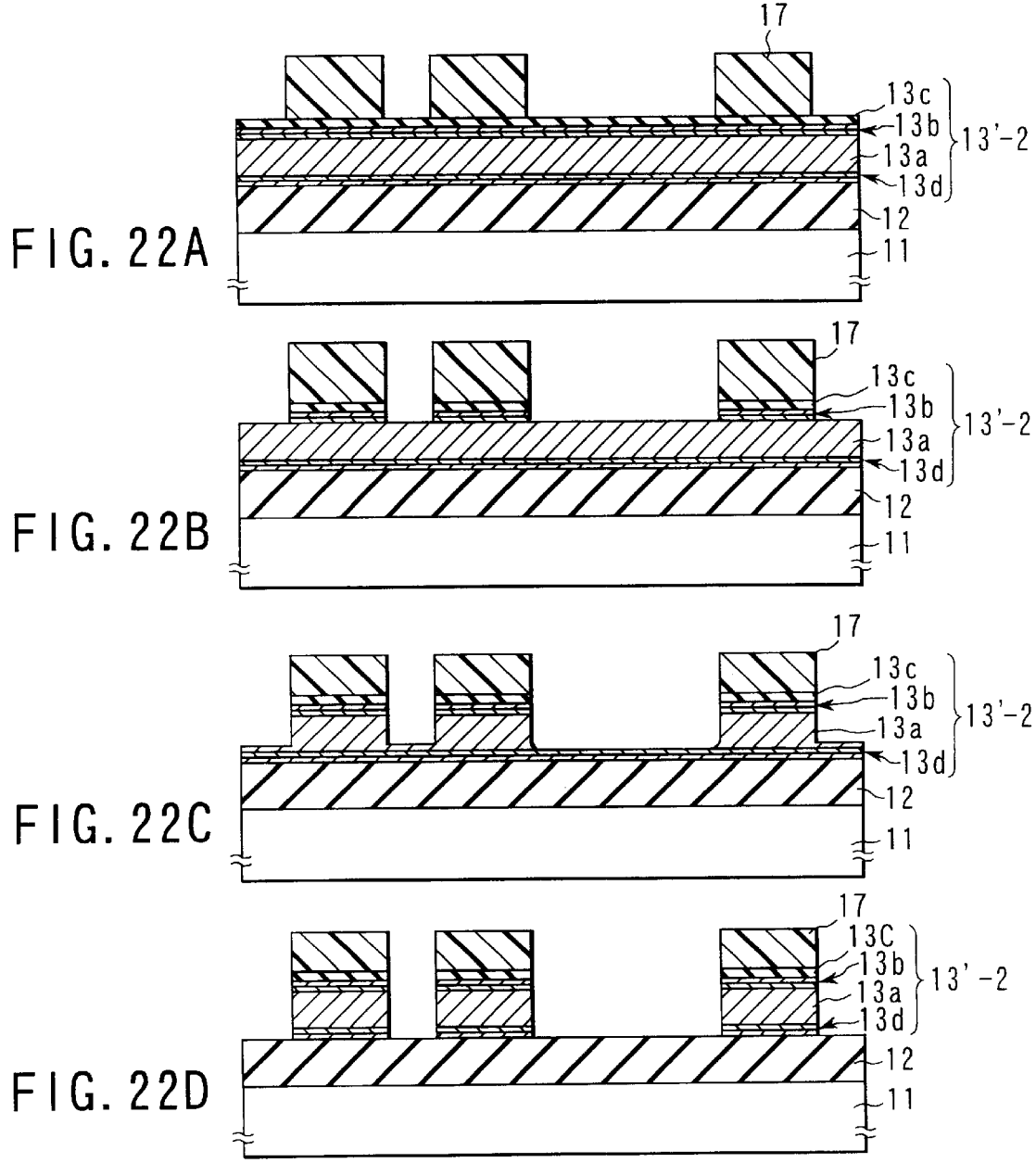
FIGS. 22A, 22B, 22C and 22D are cross-sectional views showing a method of forming metal wiring using a dry etching method according to a fifth embodiment of the present invention.

The structure illustrated in FIG. 22A is obtained by the method described with reference to FIGS. 19A and 19B. In the fifth embodiment, a reflecting prevention film 13c is formed, but it is needless to say that the film 13c need not be formed.

A reflection preventing film 13c and a thin film 13b are dry-etched using a first etching gas by the method according to the third embodiment of the present invention. The first etching gas has a gas composition in which the reflection preventing film 13c and thin film 13b are etched almost vertically and a metal film 13a is hardly etched. The first etching gas contains $Cl_2$ gas, $A_r$ gas and $CF_4$ gas. The flow-rate ratio of $Cl_2/A_r/CF_4$ is 30/100/30 or less (favorably $10 \leq CF_4 \leq 30$) sccm. Thus, the structure shown in FIG. 22B is obtained.

After that, the first etching gas is switched to a second etching gas, and the metal film 13a is dry-etched using the second etching gas. The second etching gas has a gas composition in which the metal film 13a is hardly side-etched but etched vertically. The second etching gas includes $Cl_2$ gas and $BCl_3$ gas and specifically it can be replaced with the mixture in the fourth embodiment of the present invention. Using the second etching gas, the metal film 13a containing aluminum as the base metal is dry-etched to the Al end-point. This process corresponds to the main etching described in the fourth embodiment. The structure shown in FIG. 22C is thus obtained.

The second etching gas is switched to a third etching gas, and a barrier layer 13d is dry-etched using the third etching gas. The third etching gas has a gas composition in which an etching product is prevented from being deposited excessively on the sidewall of a photoresist pattern 17. The third etching gas includes $Cl_2$ gas, $BCl_3$ gas, $N_2$ gas, and $O_2$ gas. The flow-rate ratio of $Cl_2/BCl_3/N_2/O_2$ is 60/40/5/2 sccm. The barrier layer 13d is dry-etched using the third etching gas. This process corresponds to the over-etching described in the fourth embodiment. Thus, the structure shown in FIG. 22D is obtained.

Figure 23:
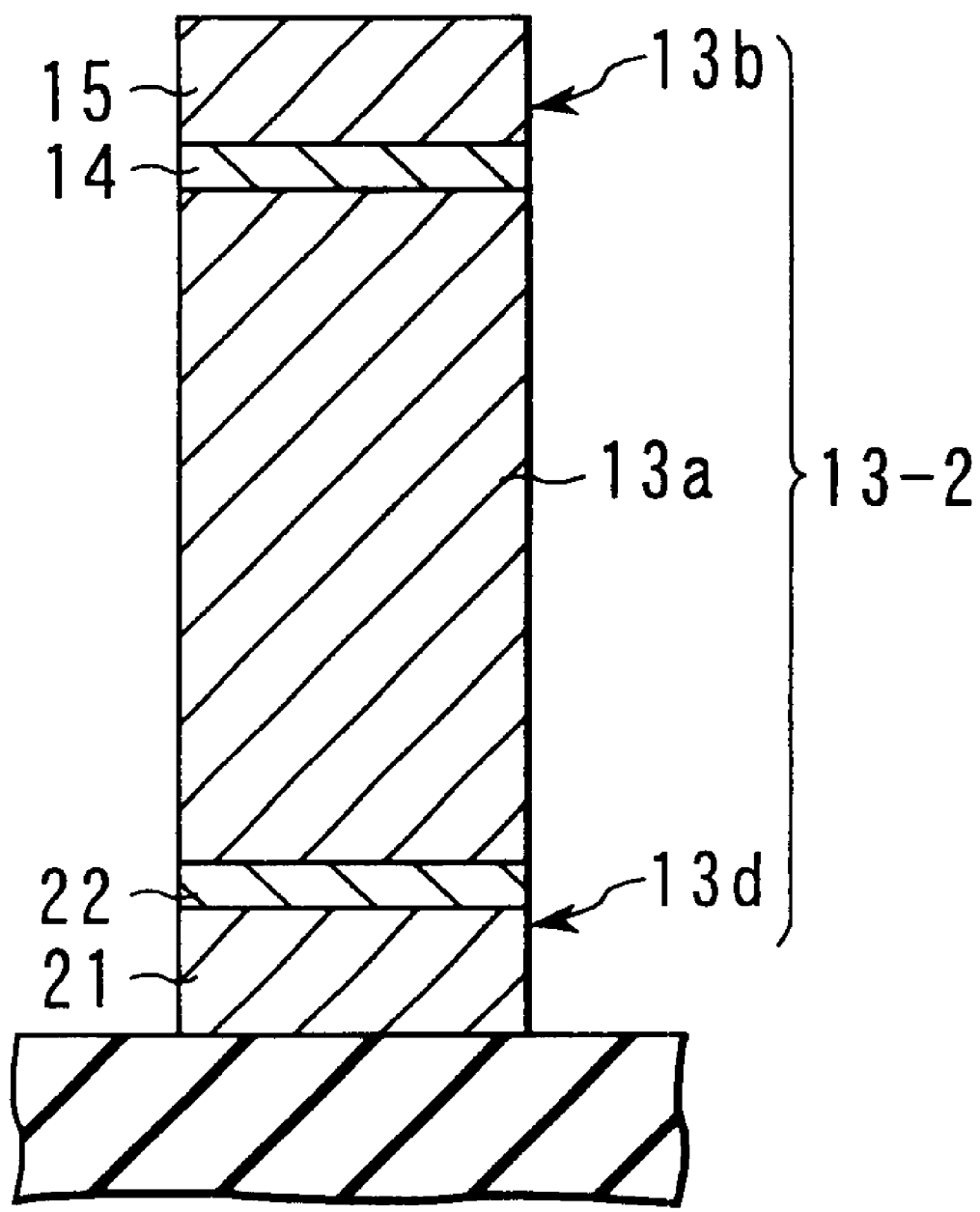
FIG. 23 is a cross-sectional view showing a shape of metal wiring formed by the dry etching method according to the fifth embodiment of the present invention.

A section of metal wiring formed by the dry etching method according to the fifth embodiment, is illustrated in FIG. 23.

As shown in FIG. 23, the thin film 13b can be etched vertically, while the metal film 13a can be etched so as to suppress its side-etching. The barrier layer 13d can be etched so as to prevent its bottom from expanding.

The present invention is not limited to the above first to fifth embodiments. Various changes and modifications can be made without departing from the scope of the subject matter of the present invention.

In the fourth and fifth embodiments, the main etching is switched to the over-etching based on the Al end-point. However, this switching can be done based on processing time.

The dry etching method of the second embodiment can be applied to the main etching of the fifth embodiment.

The thin film 13b and barrier layer 13d each have a stacked structure. However, they can have a single layer structure of titanium, tungsten, titanium nitride, or tungsten silicide.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of dry etching comprising:
    forming a mask layer on a stacked film above a semiconductor substrate, the stacked film including a metal film formed above the semiconductor substrate and containing aluminum as a base component and a thin film formed on the metal film and containing at least one of metal and a metal compound; and
    patterning the stacked film using the mask layer as a mask for etching, the patterning including:

a first step of dry etching the thin film using a first etching gas having a gas composition for preventing the metal film from being processed; and a second step of dry etching the metal film using a second etching gas having a gas composition other than that of the first etching gas.

2. The method of dry etching according to claim 1, wherein that wherein the thin film includes at least one of titanium, tungsten, titanium nitride, and tungsten silicide.

3. The method of dry etching according to claim 1, wherein the metal film contains at least one of copper and silicon.

4. The method of dry etching according to claim 1, wherein the first etching gas includes atoms of fluorine.

5. The method of dry etching according to claim 1, wherein the first etching gas includes a carbon tetrafluoride gas and a chlorine gas, and a flow rate percentage of the carbon tetrafluoride gas is 25% or more.

6. The method of dry etching according to claim 1, wherein the second step is executed first under a first condition in which a selective ratio for the mask layer is small and then under a second condition in which the selective ratio is large.

7. The method of dry etching according to claim 6, wherein the second etching gas includes atoms of chlorine and atoms of fluorine, which are fewer than the atoms of chlorine, in the first condition.

8. A method of dry etching comprising:

forming a mask layer on a stacked film above a semiconductor substrate, the stacked film including a metal film formed above the semiconductor substrate and containing aluminum as a base component, a thin film formed on the metal film and containing at least one of metal and a metal compound, and a reflection preventing film formed on the thin film; and patterning the stacked film using the mask layer as a mask for etching, the patterning including:
a first step of dry etching the reflection preventing film and the thin film using a first etching gas having a gas composition for preventing the metal film from being processed; and
a second step of dry etching the metal film (13*a*) using a second etching gas having a gas composition other than that of the first etching gas.

9. A method of dry etching comprising:

forming a mask layer on a stacked film above a semiconductor substrate, the stacked film including a barrier layer formed above the semiconductor substrate and a metal film formed on the barrier layer and containing aluminum as a base component; and patterning the stacked film using the mask layer as a mask for etching, the patterning including a step of dry etching the stacked film using an etching gas containing atoms of oxygen.

10. The method of dry etching according to claim 9, wherein the etching gas is used after part of the barrier layer is exposed.

11. The method of dry etching according to claim 9, wherein the barrier layer includes at least one of titanium, tungsten, titanium nitride, and tungsten silicide.

12. The method of dry etching according to claim 9, wherein the metal film contains at least one of copper and silicon.

13. The method of dry etching according to claim 9, wherein the etching gas includes at least one of an oxygen gas, a carbon monoxide gas, and a carbon dioxide gas.

14. The method of dry etching according to claim 9, wherein the etching gas includes oxygen of 2 sccm or more.

15. A method of dry etching comprising:

forming a mask layer on a stacked film above a semiconductor substrate, the stacked film including a barrier layer formed above the semiconductor substrate, a metal film formed on the barrier layer and containing aluminum as a base component, and a thin film formed on the metal film and including at least one of metal and a metal compound; and patterning the stacked film using the mask layer as a mask for etching, the patterning including a step of dry etching the stacked film using an etching gas containing atoms of oxygen.

16. A method of dry etching comprising:

forming a mask layer on a stacked film above a semiconductor substrate, the stacked film including a barrier layer formed above the semiconductor substrate, a metal film formed on the barrier layer and containing aluminum as a base component, a thin film formed on the metal film and including at least one of metal and a metal compound, and a reflection preventing film formed on the thin film; and patterning the stacked film using the mask layer as a mask for etching, the patterning including a step of dry etching the stacked film using an etching gas of dry etching the stacked film using an etching gas containing atoms of oxygen.

17. A method of dry etching comprising:

forming a mask layer on a stacked film above a semiconductor substrate, the stacked film including a barrier layer formed above the semiconductor substrate, a metal film formed on the barrier layer and containing aluminum as a base component, and a thin film formed on the metal film and including at least one of metal and a metal compound; and patterning the stacked film using the mask layer as a mask for etching, the patterning including:
a first step of dry etching the thin film using a first etching gas having a gas composition for preventing the metal film from being processed;
a second step of dry etching the metal film using a second etching gas having a gas composition other than that of the first etching gas; and
a third step of dry etching the barrier layer using a third etching gas containing atoms of oxygen.

18. The method of dry etching according to claim 17, wherein the first etching gas includes an argon gas, a chlorine gas, and a carbon tetrafluoride gas of 30 sccm or less, the second etching gas includes a chlorine gas and a boron trichloride, and the third etching gas includes oxygen of 2 sccm or more.

19. The method of dry etching according to claim 17, wherein the first etching gas includes atoms of fluorine.

* * * * *